(12) United States Patent
Kuwajima et al.

(10) Patent No.: US 7,608,881 B2
(45) Date of Patent: Oct. 27, 2009

(54) THIN-FILM DEVICE AND METHOD OF MANUFACTURING SAME

(75) Inventors: Hajime Kuwajima, Tokyo (JP); Masahiro Miyazaki, Tokyo (JP); Akira Furuya, Tokyo (JP)

(73) Assignee: TDK Corporation, Tokyo (JP)

( * ) Notice: Subject to any disclaimer, the term of this patent is extended or adjusted under 35 U.S.C. 154(b) by 447 days.

(21) Appl. No.: 11/588,321

(22) Filed: Oct. 27, 2006

(65) Prior Publication Data

US 2007/0120130 A1 May 31, 2007

(30) Foreign Application Priority Data

Nov. 28, 2005 (JP) ............... 2005-342403

(51) Int. Cl.
*H01L 27/108* (2006.01)
*H01L 29/94* (2006.01)

(52) U.S. Cl. ............... 257/301; 257/303; 257/306; 257/307; 257/310; 257/E29.343; 438/243; 438/386; 438/242; 438/244; 438/253; 438/387; 438/396

(58) Field of Classification Search ............ 257/301, 257/303, 306, 307, 310, E29.343; 438/243, 438/386, 242, 244, 251, 387, 396
See application file for complete search history.

(56) References Cited

U.S. PATENT DOCUMENTS 5,668,041 A * 9/1997 Okudaira et al. ............ 438/240

| 7,332,231 | B2 | 2/2008 | Ichiyanagi et al. |
| 7,355,113 | B2 | 4/2008 | Itoigawa et al. |
| 2005/0093042 | A1 * | 5/2005 | Nakazawa et al. ........ 257/295 |
| 2005/0202348 | A1 * | 9/2005 | Nakayama et al. ........ 430/311 |
| 2005/0236658 | A1 * | 10/2005 | Tahara ................ 257/306 |

FOREIGN PATENT DOCUMENTS

| JP | A-10-223476 | 8/1998 |
| JP | A 11-168306 | 6/1999 |
| JP | A-2000-100980 | 4/2000 |
| JP | A-2000-228494 | 8/2000 |
| JP | A 2003-017366 | 1/2003 |
| JP | A 2003-347155 | 12/2003 |
| JP | A-2004-207391 | 7/2004 |
| JP | A-2005-136396 | 5/2005 |

* cited by examiner

*Primary Examiner*—Kenneth A Parker
*Assistant Examiner*—Joseph Nguyen
(74) *Attorney, Agent, or Firm*—Oliff & Berridge, PLC

(57) ABSTRACT

A thin-film device comprises: a substrate; a flattening film made of an insulating material and disposed on the substrate; and a capacitor provided on the flattening film. The capacitor incorporates: a lower conductor layer disposed on the flattening film; a dielectric film disposed on the lower conductor layer; and an upper conductor layer disposed on the dielectric film. The thickness of the dielectric film falls within a range of 0.02 to 1 μm inclusive and is smaller than the thickness of the lower conductor layer. The surface roughness in maximum height of the top surface of the flattening film is smaller than that of the top surface of the substrate and equal to or smaller than the thickness of the dielectric film. The surface roughness in maximum height of the top surface of the lower conductor layer is equal to or smaller than the thickness of the dielectric film.

9 Claims, 6 Drawing Sheets portion of a top surface of substrate 2 exposed at a top surface of flattening film 3 portion of a top surface of substrate 2 exposed at a top surface of flattening film 3

THIN-FILM DEVICE AND METHOD OF MANUFACTURING SAME

BACKGROUND OF THE INVENTION

1. Field of the Invention

The present invention relates to a thin-film device comprising a lower conductor layer, a dielectric film and an upper conductor layer that are stacked, and to a method of manufacturing such a thin-film device.

2. Description of the Related Art

With increasing demands for reductions in dimensions and thickness of high frequency electronic apparatuses such as cellular phones, reductions in dimensions and profile of electronic components mounted on the high frequency electronic apparatuses have been sought. Some of the electronic components comprise capacitors. Each capacitor typically incorporates a dielectric layer and a pair of conductor layers disposed to sandwich the dielectric layer.

To achieve reductions in dimensions and profile of an electronic component comprising a capacitor, important factors are a reduction in area of a region in which the pair of conductor layers are opposed to each other with the dielectric layer disposed in between and a reduction in the number of layers making up the capacitor. Basically, in prior art, a material having a high permittivity is used as a dielectric material forming the dielectric layer and the thickness of the dielectric layer is reduced to achieve a reduction in area of the above-mentioned region and a reduction in the number of the layers making up the capacitor.

As conventional electronic components comprising capacitors, a thin-film capacitor disclosed in Japanese Published Patent Application (hereinafter referred to as JP-A) 2003-347155 and a thin-film capacitor element disclosed in JP-A 2003-17366 are known. The thin-film capacitor disclosed in JP-A 2003-347155 incorporates a lower electrode layer, a dielectric layer and an upper electrode layer formed one by one on a substrate through the use of thin-film forming techniques. The thin-film capacitor element disclosed in JP-A 2003-17366 incorporates a lower electrode, a dielectric layer and an upper electrode formed one by one on a substrate through the use of thin-film forming techniques. JP-A 2003-17366 discloses a technique in which the top surface of the lower electrode and that of an insulator layer disposed around the lower electrode are flattened to form the dielectric layer on the flattened top surfaces. An electronic component formed through thin-film forming techniques such as the above-mentioned thin-film capacitor and thin-film capacitor element is called a thin-film device in the present patent application.

JP-A 11-168306 discloses an element comprising: a dielectric substrate; a multilayer thin-film electrode made up of thin-film conductor layers and thin-film dielectric layers alternately stacked on the dielectric substrate with a bonding layer disposed between every adjacent thin-film conductor layer and thin-film dielectric layer; and a flattening film disposed between the dielectric substrate and the multilayer thin-film electrode. This publication discloses a technique in which polishing processing is performed on the top surface of the flattening film so that the surface roughness Ra of the top surface of the flattening film is 0.05 µm or smaller.

Since the dielectric layer of the thin-film device comprising a capacitor is formed through thin-film forming techniques, it is possible to reduce the thickness of the dielectric layer and to thereby reduce the profile of the thin-film device. However, if the thickness of the dielectric layer is reduced in the thin-film device comprising a capacitor, there arise problems that the withstand voltage of the capacitor is reduced and that variations in withstand voltage of the capacitor among products are increased. These problems will now be described in detail with reference to FIG. 14.

FIG. 14 is a cross-sectional view illustrating an example of configuration of a thin-film device comprising a capacitor. The thin-film device of FIG. 14 comprises: a lower conductor layer 102 disposed on a substrate 101; a dielectric layer 103 disposed on the substrate 101 and the lower conductor layer 102; and an upper conductor layer 104 disposed in a region sandwiching the dielectric layer 103 with the lower conductor layer 102. The thin-film device is fabricated by forming the lower conductor layer 102, the dielectric layer 103 and the upper conductor layer 104 in this order on the substrate 101 through the use of thin-film forming techniques.

In the thin-film device of FIG. 14, a ceramic substrate is used as the substrate 101, for example. In this case, even if the top surface of the substrate 101 is polished, there exist a number of minute holes in the top surface of the substrate 101. Accordingly, the surface roughness of the top surface of the substrate 101 is great. If the lower conductor layer 102 is formed on such a substrate 101, the surface roughness of the top surface of the lower conductor layer 102 becomes great, too, like the top surface of the substrate 101. If the surface roughness of the top surface of the lower conductor layer 102 is great, the thickness of the dielectric layer 103 is made nonuniform. Consequently, a portion that is extremely small in thickness develops in the dielectric layer 103, and insulation in the portion is degraded, which may result in an extreme reduction in withstand voltage of the capacitor. In such a case, a short-circuit failure of the capacitor resulting from a puncture of the dielectric layer 103, for example, is likely to occur. Furthermore, if the thickness of the dielectric layer 103 is nonuniform, variations in withstand voltage of the capacitor among products are increased.

In a case in which the thin-film device is designed for high frequency applications, if the surface roughness of the top surface of the lower conductor layer 102 is great, the skin resistance of the lower conductor layer 102 increases, and the signal transmission characteristic of the lower conductor layer 102 may be thereby degraded.

As described above, JP-A 2003-17366 teaches flattening the top surfaces of the lower electrode and the insulator layer disposed around the lower electrode and forming the dielectric layer on the flattened top surfaces. However, this publication does not teach the allowable degree of surface roughness of the top surface of the lower electrode in relation to the thickness of the dielectric layer.

As described above, JP-A 11-168306 discloses the technique in which the flattening film is provided between the dielectric substrate and the multilayer thin-film electrode, and polishing processing is performed on the top surface of the flattening film so that the surface roughness Ra of the top surface of the flattening film is 0.05 µm or smaller. However, this publication does not teach the allowable degree of surface roughness of the top surface of the flattening film in relation to the thickness of the thin-film dielectric layer.

The foregoing problems apply not only to thin-film devices comprising capacitors but also to thin-film devices in general each comprising a substrate and a lower conductor layer, a dielectric film and an upper conductor layer that are stacked on the substrate.

OBJECT AND SUMMARY OF THE INVENTION

It is an object of the invention to provide a thin-film device comprising a substrate and a lower conductor layer, a dielectric film and an upper conductor layer that are stacked on the substrate, the thin-film device being capable of improving the uniformity of the thickness of the dielectric film, and to provide a method of manufacturing such a thin-film device.

A thin-film device of the invention comprises: a substrate; a flattening film made of an insulating material and disposed on the substrate; a lower conductor layer disposed on the flattening film; a dielectric film disposed on the lower conductor layer; and an upper conductor layer disposed on the dielectric film.

15. In the thin-film device of the invention, the dielectric film has a thickness that falls within a range of 0.02 to 1 µm inclusive and that is smaller than the thickness of the lower conductor layer. The surface roughness in maximum height of the top surface of the flattening film is smaller than the surface roughness in maximum height of the top surface of the substrate, and is equal to or smaller than the thickness of the dielectric film. The surface roughness in maximum height of the top surface of the lower conductor layer is equal to or smaller than the thickness of the dielectric film.

A method of manufacturing the thin-film device of the invention comprises the steps of: forming the flattening film on the substrate; forming the lower conductor layer on the flattening film; forming the dielectric film on the lower conductor layer; and forming the upper conductor layer on the dielectric film.

According to the thin-film device or the method of manufacturing the same of the invention, the surface roughness in maximum height of the top surface of the lower conductor layer is equal to or smaller than the thickness of the dielectric film, so that the thickness of the dielectric film disposed on the lower conductor layer is made uniform. Furthermore, according to the invention, the surface roughness in maximum height of the top surface of the flattening film disposed on the substrate is equal to or smaller than the thickness of the dielectric film, so that it is possible to easily reduce the surface roughness in maximum height of the top surface of the lower conductor layer disposed on the flattening film.

In the thin-film device or the method of the invention, the flattening film may have a thickness that falls within a range of 0.01 to 50 µm inclusive.

In the thin-film device or the method of the invention, the lower conductor layer, the dielectric film and the upper conductor layer may constitute a capacitor.

In the method of manufacturing the thin-film device of the invention, the flattening film may be made of an inorganic material, and physical vapor deposition or chemical vapor deposition may be employed to form the flattening film in the step of forming the flattening film. In this case, the method may further comprise the step of polishing the top surface of the flattening film, the step being performed after the step of forming the flattening film and before the step of forming the lower conductor layer.

In the method of the invention, in the step of forming the flattening film, the flattening film may be formed by applying a material for forming the flattening film to the top of the substrate.

The method of the invention may further comprise the step of polishing the top surface of the lower conductor layer so that the surface roughness in maximum height of the top surface of the lower conductor layer is equal to or smaller than the thickness of the dielectric film, the step being performed after the step of forming the lower conductor layer and before the step of forming the dielectric film.

According to the thin-film device or the method of manufacturing the same of the invention, the surface roughness in maximum height of the top surface of the lower conductor layer is equal to or smaller than the thickness of the dielectric film, so that the thickness of the dielectric film disposed on the lower conductor layer is made uniform. Furthermore, according to the invention, the surface roughness in maximum height of the top surface of the flattening film disposed on the substrate is equal to or smaller than the thickness of the dielectric film, so that it is possible to easily reduce the surface roughness in maximum height of the top surface of the lower conductor layer disposed on the flattening film. These features of the invention make it possible to improve the uniformity of the thickness of the dielectric film.

Other and further objects, features and advantages of the invention will appear more fully from the following description.

DESCRIPTION OF A PREFERRED EMBODIMENT

Figure 1:
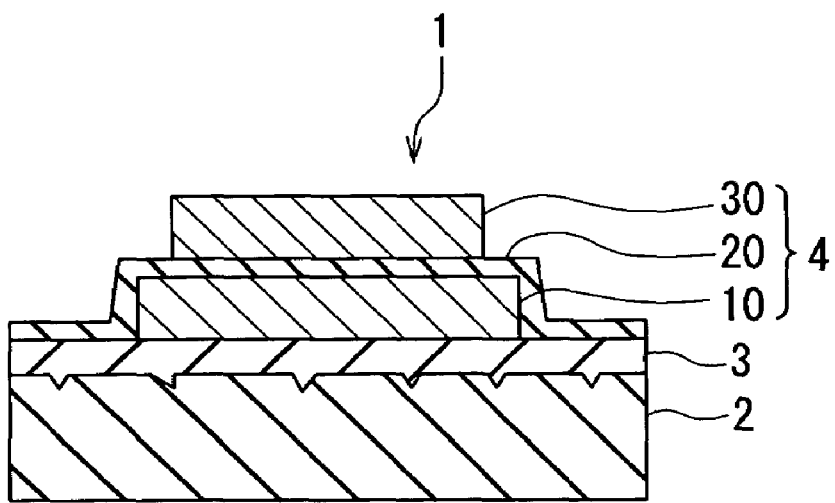
FIG. 1 is a cross-sectional view of a thin-film device of an embodiment of the invention.

A preferred embodiment of the invention will now be described with reference to the accompanying drawings. Reference is now made to FIG. 1 to describe a thin-film device of an embodiment of the invention. FIG. 1 is a cross-sectional view of the thin-film device of the embodiment. As shown in FIG. 1, the thin-film device 1 of the embodiment comprises: a substrate 2; a flattening film 3 made of an insulating material and disposed on the substrate 2; and a capacitor 4 provided on the flattening film 3. The capacitor 4 incorporates: a lower conductor layer 10 disposed on the flattening film 3; a dielectric film 20 disposed on the lower conductor layer 10; and an upper conductor layer 30 disposed on the dielectric film 20.

Each of the lower conductor layer 10 and the upper conductor layer 30 is patterned into a specific shape. The dielectric film 20 is disposed to cover the top and side surfaces of the lower conductor layer 10 and the top surface of the flattening film 3. The upper conductor layer 30 is disposed in a region sandwiching the dielectric film 20 with the lower conductor layer 10. The lower conductor layer 10 and the upper conductor layer 30 make up a pair of electrodes opposed to each other with the dielectric film 20 disposed in between in the capacitor 4.

The substrate 2 is made of an insulating material (a dielectric material). The insulating material forming the substrate 2 may be an inorganic material or an organic material. The insulating material forming the substrate 2 may be $Al_2O_3$, for example. The substrate 2 may be made of a semiconductor material.

A ceramic substrate may be used as the substrate 2. In this case, even if the top surface of the substrate 2 is polished, there exist a number of voids or minute holes in the top surface of the substrate 2. Here is given a result of examining diameters of voids present in the top surface of a ceramic substrate when the top surface of the substrate made of $Al_2O_3$ had been polished, wherein three types of ceramic substrates in which the purities of $Al_2O_3$ were 99.6%, 96% and 93%, respectively, were used. In addition, ten regions each of which was a square whose side was 0.5 mm long were defined on the top surface of each of the ceramic substrates, and a mean void diameter (μm) and a maximum void diameter (μm) in these regions were measured. The results of measurement are shown in the table below.

TABLE 1

| Purity | Mean void diameter | Maximum void diameter |
|---|---|---|
| 99.6% | 1.4 | 4.1 |
| 96% | 2.7 | 10 |
| 93% | 3.1 | 14 |

As shown in the table, the higher the purity of $Al_2O_3$, the smaller are the mean void diameter and the maximum void diameter. However, there exist relatively large voids in the top surface of the ceramic substrate even when the purity is as high as 99.6%. The surface roughness of the top surface of the ceramic substrate is thereby increased.

In the embodiment the flattening film 3 is formed on the substrate 2, so that the surface roughness of the base of the lower conductor layer 10 is reduced even when a ceramic substrate is used as the substrate 2.

The insulating material forming the flattening film 3 may be an inorganic material or an organic material. An inorganic material forming the flattening film 3 may be $Al_2O_3$, for example. When an inorganic material is used as the material of the flattening film 3, it is preferred to form the flattening film 3 by physical vapor deposition (PVD) or chemical vapor deposition (CVD). An organic material forming the flattening film 3 may be a resin, for example. In this case, the resin may be either a thermoplastic resin or a thermosetting resin. When an organic material such as a resin is used as the material of the flattening film 3, it is preferred that the organic material to form the flattening film 3 be applied to the top of the substrate 2 while the material exhibits fluidity, and then the organic material be hardened to form the flattening film 3. The flattening film 3 may be made of a spin-on-glass (SOG) film. The flattening film 3 may be formed through an ink-jet technique.

The surface roughness in maximum height Rz of the top surface of the flattening film 3 is smaller than the surface roughness in maximum height Rz of the top surface of the substrate 2. The surface roughness in maximum height Rz is one of parameters indicating the surface roughness and is defined as a sum of the maximum value of the peak and the maximum value of the valley of a contour curve of a unit length. The thickness of the flattening film 3 preferably falls within a range of 0.01 to 50 μm inclusive.

If a flattening film made of a conductive material is disposed on the substrate 2 in place of the flattening film 3 made of an insulating material, there arise problems such as one that the lower conductor layer 10 is brought into conduction, through the flattening film, with another conductor layer disposed on the flattening film. Therefore, the flattening film 3 made of an insulating material is disposed on the substrate 2 in the embodiment.

The lower conductor layer 10 and the upper conductor layer 30 are made of a conductive material such as Cu. The dielectric film 20 is made of a dielectric material. The dielectric material forming the dielectric film 20 is preferably an inorganic material. The dielectric material forming the dielectric film 20 may be any of $Al_2O_3$, $Si_4N_3$ and $SiO_2$, for example.

The thickness of the dielectric film 20 falls within a range of 0.02 to 1 μm inclusive, and is smaller than the thickness of the lower conductor layer 10. The thickness of the dielectric film 20 preferably falls within a range of 0.05 to 0.5 μm inclusive. The thickness of the lower conductor layer 10 preferably falls within a range of 5 to 10 μm inclusive. The thickness of the upper conductor layer 30 preferably falls within a range of 5 to 10 μm inclusive.

The reason why it is preferred that the thicknesses of the lower conductor layer 10 and the upper conductor layer 30 fall within the above-mentioned ranges will now be described. The thin-film device of the embodiment is used in a band-pass filter for a wireless local area network (LAN) or for a cellular phone. For the wireless LAN a frequency band of 2.5 GHz is used. Considering the passing loss in this frequency band, it is required that the thickness of each of the lower conductor layer 10 and the upper conductor layer 30 be 3 μm or greater. That is, if the thickness of each of the lower conductor layer 10 and the upper conductor layer 30 is smaller than 3 μm, the passing loss will be too great. In addition, a frequency band of 800 MHz to 1.95 GHz is used for cellular phones. To improve the attenuation characteristic of the band-pass filter and to suppress noise at low frequencies in this frequency band in particular, it is required that the thickness of each of the lower conductor layer 10 and the upper conductor layer 30 be 5 μm or greater. Therefore, it is preferred that the thickness of each of the lower conductor layer 10 and the upper conductor layer 30 be 5 μm or greater. On the other hand, if each of the lower conductor layer 10 and the upper conductor layer 30 is too thick, the surface roughness of the top surface of each of the lower conductor layer 10 and the upper conductor layer 30 is increased and the skin resistance of each of the lower conductor layer 10 and the upper conductor layer 30 is thereby increased, or it becomes necessary to perform flattening processing for reducing the surface roughness of the top surface of each of the lower conductor layer 10 and the upper conductor layer 30, which requires time and labor. Therefore, it is practically preferred that the thickness of each of the lower conductor layer 10 and the upper conductor layer 30 be 10 μm or smaller.

In the embodiment it is defined that the surface roughness in maximum height Rz of the top surface of the lower conductor layer 10 is equal to or smaller than the thickness of the dielectric film 20. This is defined based on the result of an experiment that will now be described.

Figure 12:
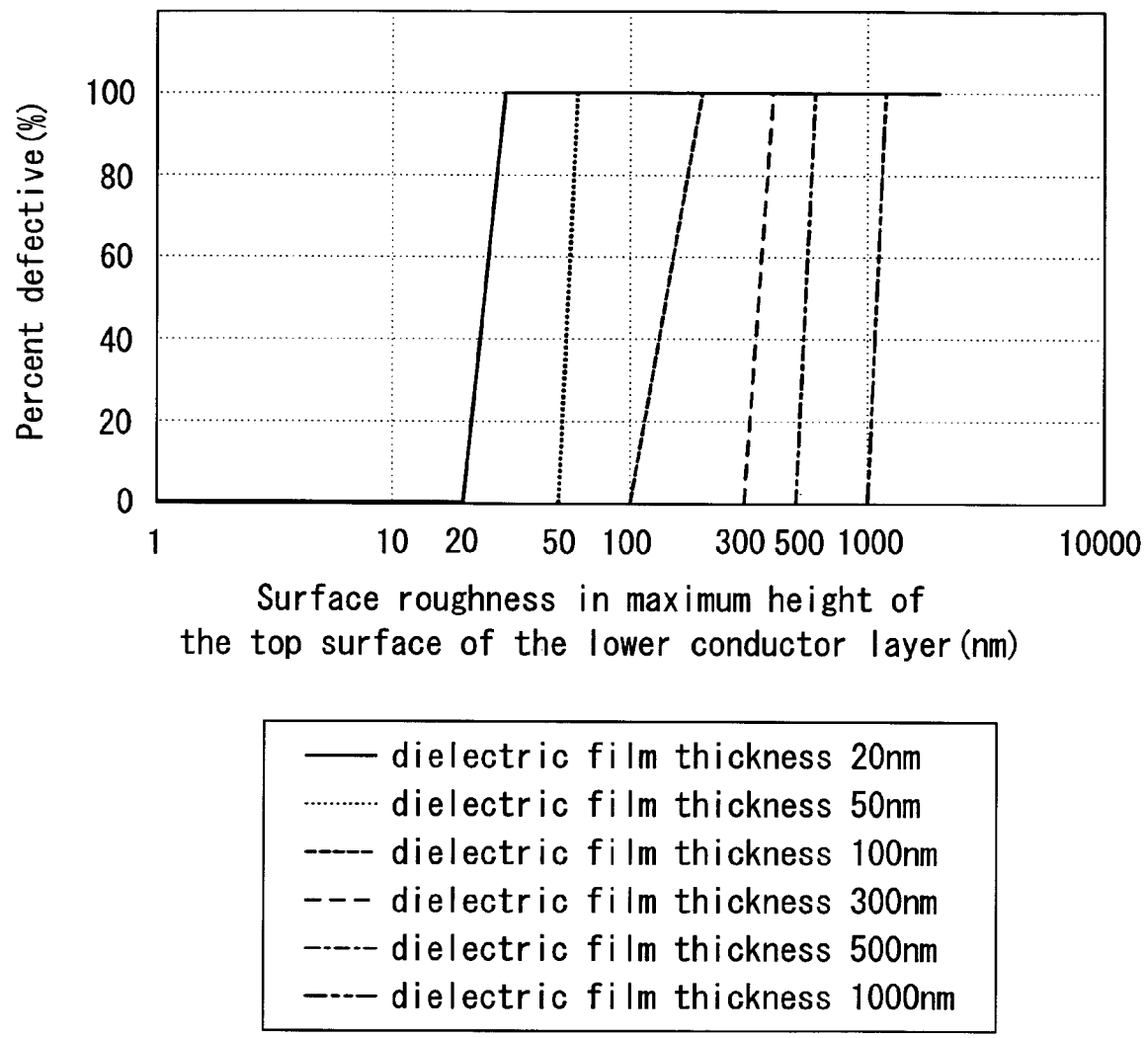
FIG. 12 is a plot showing the relationship between the percent defective of the capacitor and the surface roughness in maximum height of the top surface of the lower conductor layer of the embodiment of the invention.

In the experiment, first, a number of samples of the capacitor 4 were fabricated, the samples being different in thickness of the dielectric film 20 and in surface roughness in maximum height Rz of the top surface of the lower conductor layer 10. The percent defective of the capacitor 4 in terms of short-circuit failures was measured for each of the samples, wherein the percent defective was defined as a percentage of occurrences of short-circuit failures of the capacitor 4 when a voltage of 3 volts was applied to each of the samples. The dielectric film 20 of each of the samples had a thickness of any of six types, that is, 20 nm, 50 nm, 100 nm, 300 nm, 500 nm and 1000 nm. The surface roughness in maximum height Rz of the top surface of the lower conductor layer 10 of each of the samples fell within a range of 1 to 2000 nm inclusive. FIG. 12 shows the result of the experiment. FIG. 12 is a plot showing the relationship between the percent defective of the capacitor 4 and the surface roughness in maximum height Rz of the top surface of the lower conductor layer 10.

As shown in FIG. 12, in cases where the thickness of the dielectric film 20 is any of the above-mentioned six types, a short-circuit failure of the capacitor 4 may occur if the surface roughness in maximum height Rz of the top surface of the lower conductor layer 10 is greater than the thickness of the dielectric film 20, whereas no short-circuit failure of the capacitor 4 will occur if the surface roughness in maximum height Rz of the top surface of the lower conductor layer 10 is equal to or smaller than the thickness of the dielectric film 20. This teaches that, as long as the surface roughness in maximum height Rz of the top surface of the lower conductor layer 10 is equal to or smaller than the thickness of the dielectric film 20, it is possible to prevent a short-circuit failure of the capacitor 4 caused by, for example, a puncture of the dielectric film 20 resulting from a reduction in withstand voltage of the capacitor 4. Because of the foregoing, the embodiment requires that the surface roughness in maximum height Rz of the top surface of the lower conductor layer 10 be equal to or smaller than the thickness of the dielectric film 20.

In addition, the embodiment requires that the surface roughness in maximum height Rz of the top surface of the flattening film 3 be equal to or smaller than the thickness of the dielectric film 20. If the lower conductor layer 10 is formed on the flattening film 3, the surface roughness in maximum height Rz of the top surface of the lower conductor layer 10 is close to that of the top surface of the flattening film 3. Therefore, as long as the surface roughness in maximum height Rz of the top surface of the flattening film 3 is equal to or smaller than the thickness of the dielectric film 20, it is possible to easily make the surface roughness in maximum height Rz of the top surface of the lower conductor layer 10 equal to or smaller than the thickness of the dielectric film 20 without performing any flattening processing on the top surface of the lower conductor layer 10 or by performing simple flattening processing on the top surface of the lower conductor layer 10. Because of the foregoing, the embodiment requires that the surface roughness in maximum height Rz of the top surface of the flattening film 3 be equal to or smaller than the thickness of the dielectric film 20.

Reference is now made to FIG. 2 to FIG. 11 to describe a method of manufacturing the thin-film device 1 of the embodiment. Although examples of materials and thicknesses of the layers are given in the following description, those examples are non-limiting for the method of the embodiment.

Figure 2:
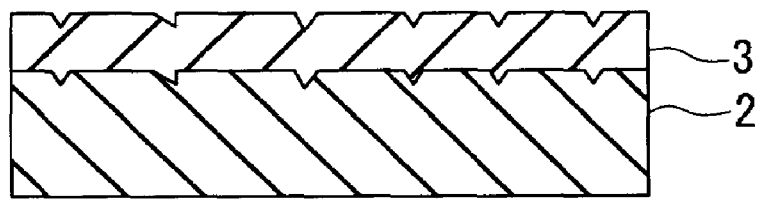
FIG. 2 is a cross-sectional view illustrating a step of a method of manufacturing the thin-film device of the embodiment of the invention.

FIG. 2 is a cross-sectional view illustrating a step of the method of manufacturing the thin-film device 1 of the embodiment. In the method, first, as shown in FIG. 2, the flattening film 3 is formed on the substrate 2. Here is given an example in which the substrate 2 is a ceramic substrate wherein the purity of $Al_2O_3$ is 99.6% and the top surface of the substrate is polished. In this case, the maximum void diameter in the top surface of the substrate 2 is 4.1 μm, for example. Here, by way of example, the insulating material forming the flattening film 3 is $Al_2O_3$ that is an inorganic material, and the flattening film 3 is formed by PVD or CVD. The flattening film 3 thus formed is more closely packed than a ceramic. The thickness of the flattening film 3 at this point is 5.5 μm, for example.

Figure 3:
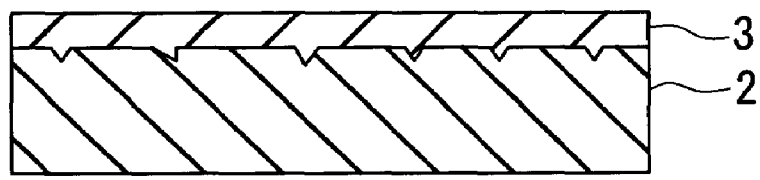
FIG. 3 is a cross-sectional view illustrating a step that follows the step of FIG. 2.

Next, as shown in FIG. 3, the top surface of the flattening film 3 is flattened by polishing so that the surface roughness in maximum height Rz of the top surface of the flattening film 3 is equal to or smaller than the thickness of the dielectric film 20 that will be formed later. For example, when the dielectric film 20 having a thickness of 0.1 μm is to be made, the top surface of the flattening film 3 is polished so that the surface roughness in maximum height Rz of the top surface of the flattening film 3 is equal to or smaller than 0.1 μm. A method of this polishing is chemical mechanical polishing (CMP), for example. The thickness of the flattening film 3 polished is 2.0 μm, for example. Here, by way of example, the surface roughness in maximum height Rz of the top surface of the flattening film 3 polished is 30 nm. The method of polishing the top surface of the flattening film 3 is not limited to CMP but may be any other polishing method such as buffing, lapping and die polishing. The processing of flattening the top surface of the flattening film 3 may be performed by a combination of two or more polishing methods.

The flattening film 3 made of $Al_2O_3$ and formed by PVD or CVD is very closely packed as described above. As a result, there exist no minute holes in the top surface of the flattening film 3 polished, such as holes existing in the top surface of a ceramic substrate polished. It is therefore possible by polishing the top surface of the flattening film 3 to easily flatten the top surface of the flattening film 3 so that the surface roughness in maximum height Rz of the top surface of the flattening film 3 is equal to or smaller than the thickness of the dielectric film 20.

It is not necessary to flatten the top surface of the flattening film 3 by polishing in such a case that the surface roughness in maximum height Rz of the top surface of the flattening film 3 is equal to or smaller than the thickness of the dielectric film 20 without flattening the top surface of the flattening film 3.

The flattening film 3 may be made of an organic material such as a resin. In this case, the flattening film 3 may be formed in such a manner that the organic material to form the flattening film 3 is applied to the top of the substrate 2 while the material exhibits fluidity, and then the organic material is hardened. The flattening film 3 may be made of a spin-on-glass (SOG) film. The flattening film 3 may be formed through an ink-jet technique. In these cases, it is possible to make the surface roughness in maximum height Rz of the top surface of the flattening film 3 equal to or smaller than the thickness of the dielectric film 20 without polishing the top surface of the flattening film 3.

Figure 4:
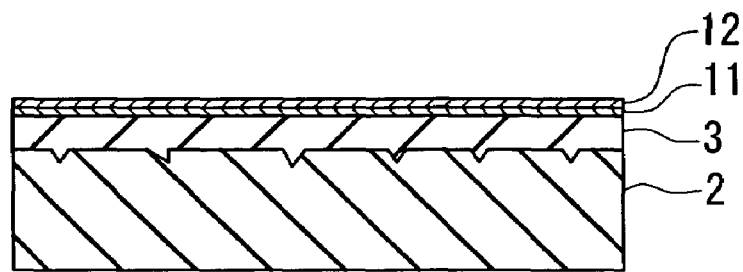
FIG. 4 is a cross-sectional view illustrating a step that follows the step of FIG. 3.

Next, as shown in FIG. 4, a first electrode film 11 and a second electrode film 12 are formed one by one on the substrate 2 by sputtering, for example. The electrode films 11 and 12 will be used as electrodes when a plating film is formed by electroplating later and will make up part of the lower conductor layer 10. The material of the first electrode film 11 is Ti, for example. The thickness of the first electrode film 11 is 5 nm, for example. The material of the second electrode film 12 is Cu or Ni, for example. The thickness of the second electrode film 12 is 100 nm, for example. Alternatively, a single-layer electrode film may be formed in place of the electrode films 11 and 12.

Figure 5:
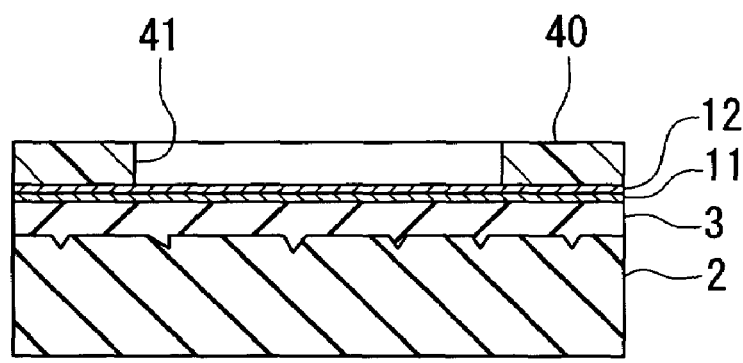
FIG. 5 is a cross-sectional view illustrating a step that follows the step of FIG. 4.

FIG. 5 illustrates the following step. In the step, first, a photoresist layer having a thickness of 8 μm, for example, is formed on the electrode film 12. Next, the photoresist layer is patterned by photolithography to form a frame 40. The frame 40 has a groove 41 having a shape corresponding to the shape of the lower conductor layer 10 to be formed.

Figure 6:
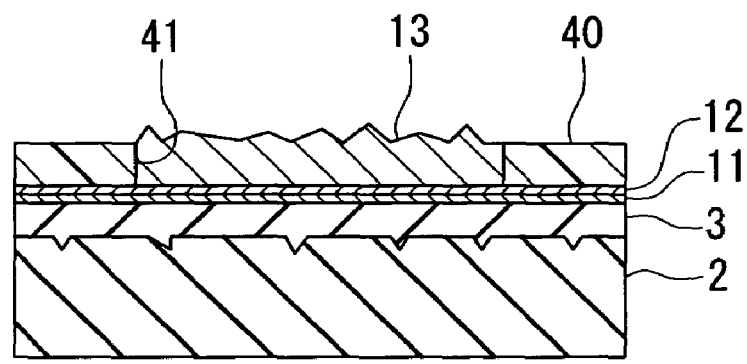
FIG. 6 is a cross-sectional view illustrating a step that follows the step of FIG. 5.

Next, as shown in FIG. 6, the plating film 13 is formed in the groove 41 by electroplating using the electrode films 11 and 12 as electrodes. The material of the plating film 13 is Cu, for example. The thickness of the plating film 13 is 9 to 10 µm, for example.

Figure 7:
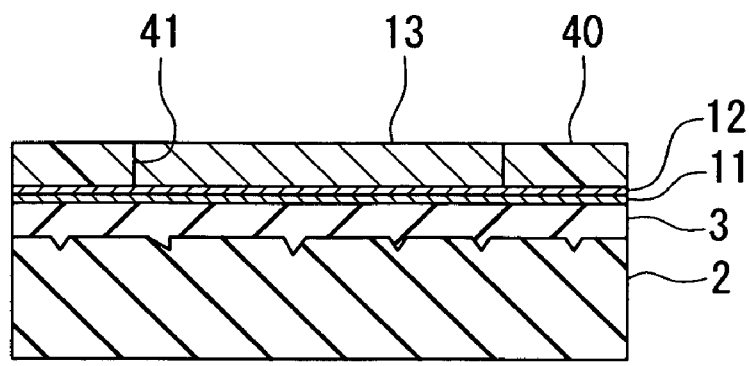
FIG. 7 is a cross-sectional view illustrating a step that follows the step of FIG. 6.
Figure 8:
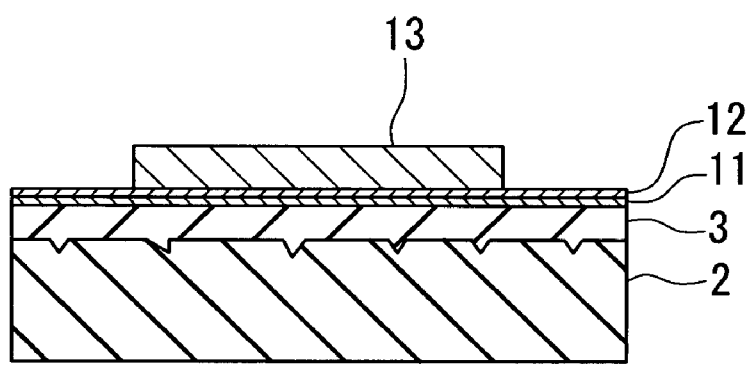
FIG. 8 is a cross-sectional view illustrating a step that follows the step of FIG. 7.

Next, as shown in FIG. 7, the top surface of the plating film 13 is flattened by polishing so that the surface roughness in maximum height Rz of the top surface of the plating film 13 is equal to or smaller than the thickness of the dielectric film 20 that will be formed later. For example, when the dielectric film 20 having a thickness of 0.1 µm is to be made, the top surface of the plating film 13 is polished so that the surface roughness in maximum height Rz of the top surface of the plating film 13 is equal to or smaller than 0.1 µm. A method of this polishing is CMP, for example. The polishing is performed such that the thickness of the plating film 13 polished is 8 µm, for example. The method of polishing the top surface of the plating film 13 is not limited to CMP but may be any other polishing method such as buffing, lapping and die polishing. The processing of flattening the top surface of the plating film 13 may be performed by a combination of two or more polishing methods. Next, as shown in FIG. 8, the frame 40 is removed.

In the step shown in FIG. 6, if the plating film 13 is formed so that the thickness of the plating film 13 is greater than the thickness of the frame 40, portions of the plating film 13 out of the groove 41 of the frame 40 may be polished, and polishing may be stopped when the thickness of the plating film 13 coincides with that of the frame 40 in the step shown in FIG. 7. In this case, it is possible to precisely control the thickness of the lower conductor layer 10 formed of the plating film 13. Furthermore, if the amount of polishing of the frame 40 is great, the polishing device such as a grindstone may be loaded, and flattening of the top surface of the plating film 13 may be thereby disturbed. Such a failure can be prevented if the polishing is stopped when the thickness of the plating film 13 coincides with that of the frame 40.

In the embodiment the top surface of the flattening film 3 is sufficiently flat so that the surface roughness in maximum height Rz of the top surface of the flattening film 3 is equal to or smaller than the thickness of the dielectric film 20. Consequently, it is likely that the top surface of the plating film 13 formed above the flattening film 3 with the electrode films 11 and 12 disposed in between is flat. Therefore, it is not necessary to flatten the top surface of the plating film 13 by polishing in such a case that the surface roughness in maximum height Rz of the top surface of the plating film 13 is equal to or smaller than the thickness of the dielectric film 20 without polishing the top surface of the plating film 13. Furthermore, in the embodiment, also in the case in which the top surface of the plating film 13 is flattened by polishing, it is easy to flatten the top surface of the plating film 13 so that the surface roughness in maximum height Rz of the top surface of the plating film 13 is equal to or smaller than the thickness of the dielectric film 20.

Figure 9:
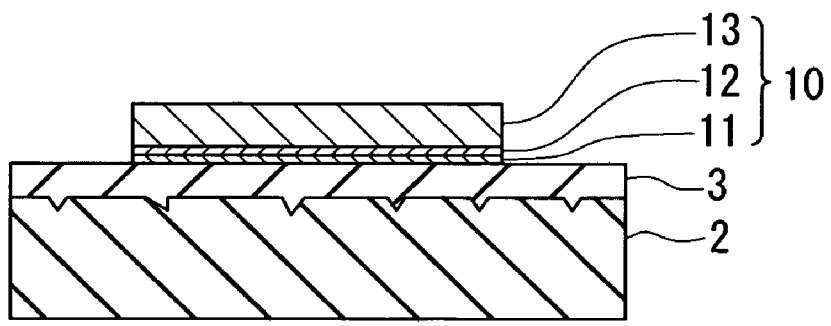
FIG. 9 is a cross-sectional view illustrating a step that follows the step of FIG. 8.

Next, as shown in FIG. 9, the electrode films 11 and 12 except portions thereof located below the plating film 13 are removed by dry etching or wet etching. As a result, the lower conductor layer 10 is formed of the remaining electrode films 11 and 12 and the plating film 13. If the material of each of the electrode film 12 and the plating film 13 is Cu, a portion of the plating film 13 is etched, too, when etching is performed to remove the electrode films 11 and 12. However, there is hardly any difference between the surface roughness of the top surface of the plating film 13 before this etching and that after this etching. If the material of the electrode film 12 is Ni and the material of the plating film 13 is Cu, a condition under which the plating film 13 is not etched is chosen for the etching for removing the electrode films 11 and 12. The surface roughness in maximum height Rz of the top surface of the lower conductor layer 10 formed in the step shown in FIG. 9 is equal to or smaller than the thickness of the dielectric film 20 that will be formed later.

In the steps shown in FIG. 5 to FIG. 9, the plating film 13 patterned through the use of the frame 40 is formed and then the electrode films 11 and 12 except the portions thereof located below the plating film 13 are removed to form the lower electrode layer 10. Instead of employing such a process, the lower electrode layer 10 may be formed by forming an unpatterned plating film on the entire top surfaces of the electrode films 11 and 12 and then removing portions of the plating film and the electrode films 11 and 12. Alternatively, the lower electrode layer 10 may be formed by forming an unpatterned conductor film on the flattening film 3 by PVD such as sputtering or evaporation and then etching a portion of the conductor film. When the lower electrode layer 10 is formed by PVD, in particular, it is possible to make the surface roughness in maximum height Rz of the top surface of the lower electrode layer 10 equal to or smaller than the thickness of the dielectric film 20 without polishing the top surface of the lower electrode layer 10.

When the lower conductor layer 10 is formed by electroplating, it is preferred to adjust the sizes of precipitation grains by controlling the composition of plating bath and the current density. In addition, when the lower conductor layer 10 is formed by electroplating, it is preferred that, for suppressing a change in the surface roughness of the top surface of the lower conductor layer 10 with time, heat treatment be performed on the lower conductor layer 10 so that the lower conductor layer 10 is in equilibrium and then the dielectric film 20 be formed on the lower conductor layer 10. When the lower conductor layer 10 is formed by PVD, heat treatment of the lower conductor layer 10 is not required since it is nearly in the state of equilibrium.

Figure 10:
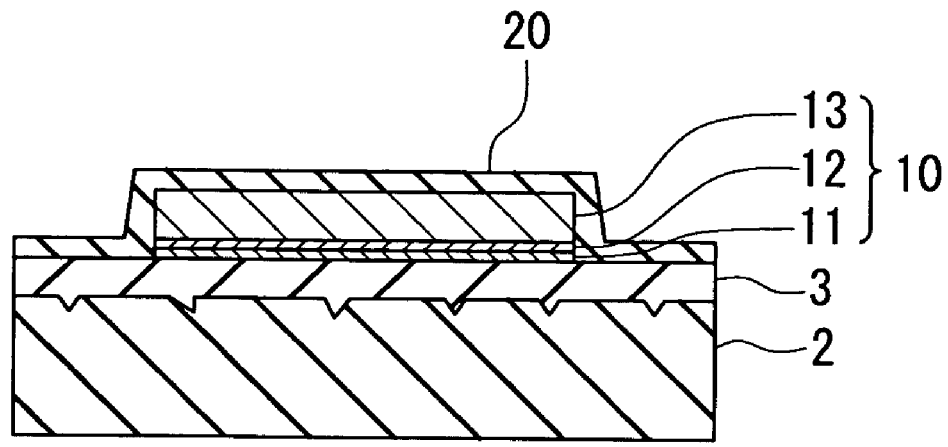
FIG. 10 is a cross-sectional view illustrating a step that follows the step of FIG. 9.

Next, as shown in FIG. 10, the dielectric film 20 is formed by sputtering, for example, to cover the top and side surfaces of the lower conductor layer 10 and the top surface of the flattening film 3. The thickness of the dielectric film 20 is 0.1 µm, for example.

Figure 11:
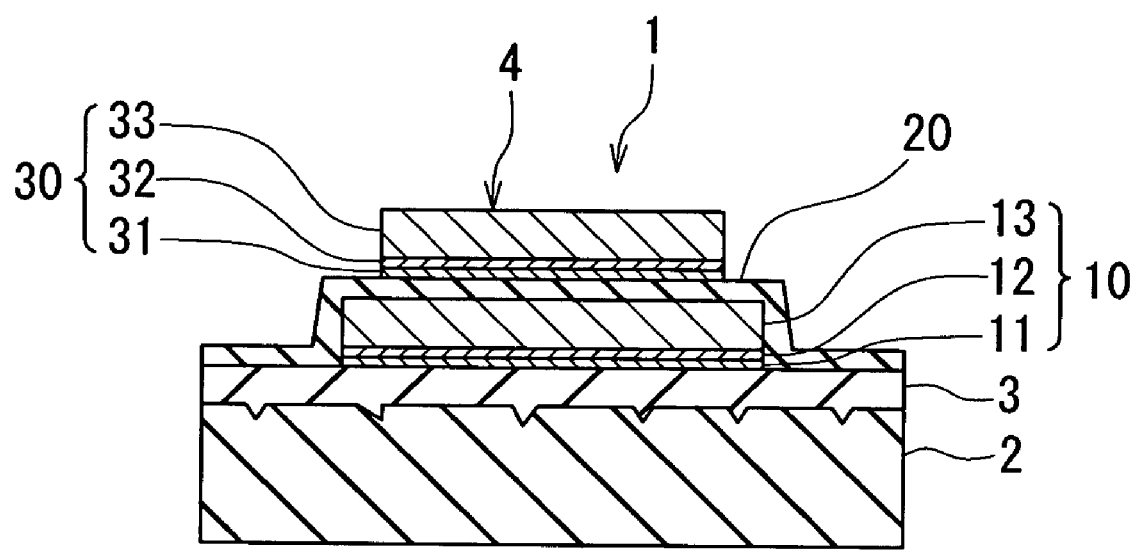
FIG. 11 is a cross-sectional view illustrating a step that follows the step of FIG. 10.

Next, as shown in FIG. 11, the upper conductor layer 30 is formed in a region that is on the dielectric film 20 and that sandwiches the dielectric film 20 with the lower conductor layer 10. A method of forming the upper conductor layer 30 is the same as that of the lower conductor layer 10 except the flattening processing. That is, electrode films 31 and 32 are first formed in this order on the dielectric film 20. The materials and thicknesses of the electrode films 31 and 32 are the same as those of the electrode films 11 and 12. Next, a photoresist layer having a thickness of 8 µm, for example, is formed on the electrode film 32. Next, the photoresist layer is patterned by photolithography to form a frame not shown. The frame has a groove having a shape corresponding to the shape of the upper conductor layer 30 to be formed. Next, a plating film 33 is formed in the groove by electroplating using the electrode films 31 and 32 as electrodes. The material of the plating film 33 is Cu, for example. The thickness of the plating film 33 is 8 µm, for example. Next, the frame is removed. Next, the electrode films 31 and 32 except portions thereof located below the plating film 33 are removed by dry etching or wet etching. As a result, the upper conductor layer 30 is formed of the remaining electrode films 31 and 32 and the plating film 33.

According to the embodiment as thus described, the flattening film 3 is formed on the substrate 2, and the surface roughness in maximum height Rz of the top surface of the flattening film 3 is made equal to or smaller than the thickness of the dielectric film 20. The lower conductor layer 10 and the dielectric film 20 are then formed one by one on the flattening film 3. Therefore, according to the embodiment, it is easy to flatten the top surface of the lower conductor layer 10 so that the surface roughness in maximum height Rz thereof is equal to or smaller than the thickness of the dielectric film 20. As a result, it is possible to improve the uniformity of the thickness of the dielectric film 20. It is thereby possible to suppress a reduction in withstand voltage of the capacitor 4 and an increase in variation in withstand voltage of the capacitor 4 among products. For example, it is possible to make the withstand voltage of the capacitor 4 equal to or greater than 80 volts if the top surface of the lower conductor layer 10 is flattened as in the embodiment under a condition in which the withstand voltage of the capacitor 4 is equal to or smaller than 30 volts if the top surface of the lower conductor layer 10 is not flattened. Furthermore, according to the embodiment, since a reduction in withstand voltage of the capacitor 4 is suppressed, it is possible to prevent a short-circuit failure of the capacitor 4 caused by a puncture of the dielectric film 20, for example.

According to the embodiment, since the thickness of the dielectric film 20 is made uniform, it is possible to make the dielectric film 20 thin while maintaining a sufficient withstand voltage of the capacitor 4. As a result, in cases where capacitors having the same capacitances are to be implemented, it is possible to reduce the area of a region in which the lower conductor layer 10 and the upper conductor layer 30 are opposed to each other with the dielectric film 20 disposed in between and to reduce the number of conductor layers and dielectric films to be stacked. It is thereby possible to achieve reductions in dimensions and profile of the thin-film device.

Furthermore, according to the embodiment, since the surface roughness of the top surface of the lower conductor layer 10 is small, it is possible to reduce the skin resistance of the lower conductor layer 10. As a result, it is possible to prevent degradation of the signal transmission characteristic of the lower conductor layer 10 when the thin-film device 1 is designed for high frequency applications.

In the embodiment, inverse sputtering may be performed before forming the dielectric film 20 to remove unwanted substances such as oxides and organic substances present on the surface of the lower conductor layer 10 and to activate the surface of the lower conductor layer 10 so as to improve the contact of the surface of the lower conductor layer 10 with the dielectric film 20. In this case, in particular, processing of improving the contact of the surface of the lower conductor layer 10 with the dielectric film 20 and processing of forming the dielectric film 20 may be performed consecutively in a single vacuum chamber, so that the contact of the lower conductor layer 10 with the dielectric film 20 is further improved.

It is also possible that, before forming the electrode film 11 or 31, inverse sputtering is performed to remove unwanted substances such as oxides and organic substances present on the surface of the base of the electrode film 11 or 31 and to improve the contact of the surface of the base with the electrode film 11 or 31.

In the step of forming the lower conductor layer 10 or the step of forming the upper conductor layer 30, inverse sputtering is employed, for example, as the method of removing the electrode films except the portions thereof located below the plating film. In this case, there is a possibility of damaging the top surface of the lower conductor layer 10, the upper conductor layer 30 or the dielectric film 20, depending on the conditions for the inverse sputtering. Methods for preventing this include removing the electrode films by wet etching, and adjusting the output and duration of inverse sputtering when the electrode films are removed by inverse sputtering. Alternatively, a film of a material (such as Ni) that is not used for the electrode films may be formed by plating, for example, on the plating film made of Cu, for example, and the electrode films may be selectively etched by inverse sputtering. Another alternative is that, a sputter film of Cu may be formed on the plating film made of Cu, for example. In this case, the crystal grain diameter of the sputter film is smaller than that of the plating film, and therefore it is possible to prevent the top surface of the lower conductor layer 10 or the upper conductor layer 30 from being damaged by inverse sputtering.

In the case of performing inverse sputtering after the dielectric film 20 is formed and before the electrode film 31 is formed, and/or in the case of removing the electrode films 31 and 32 by inverse sputtering to form the upper conductor layer 30, it is necessary to adjust the conditions for the inverse sputtering such as the output, gas flow rate, and process time so as to prevent a reduction in thickness of the dielectric film 20 and damage to the dielectric film 20.

Figure 13:
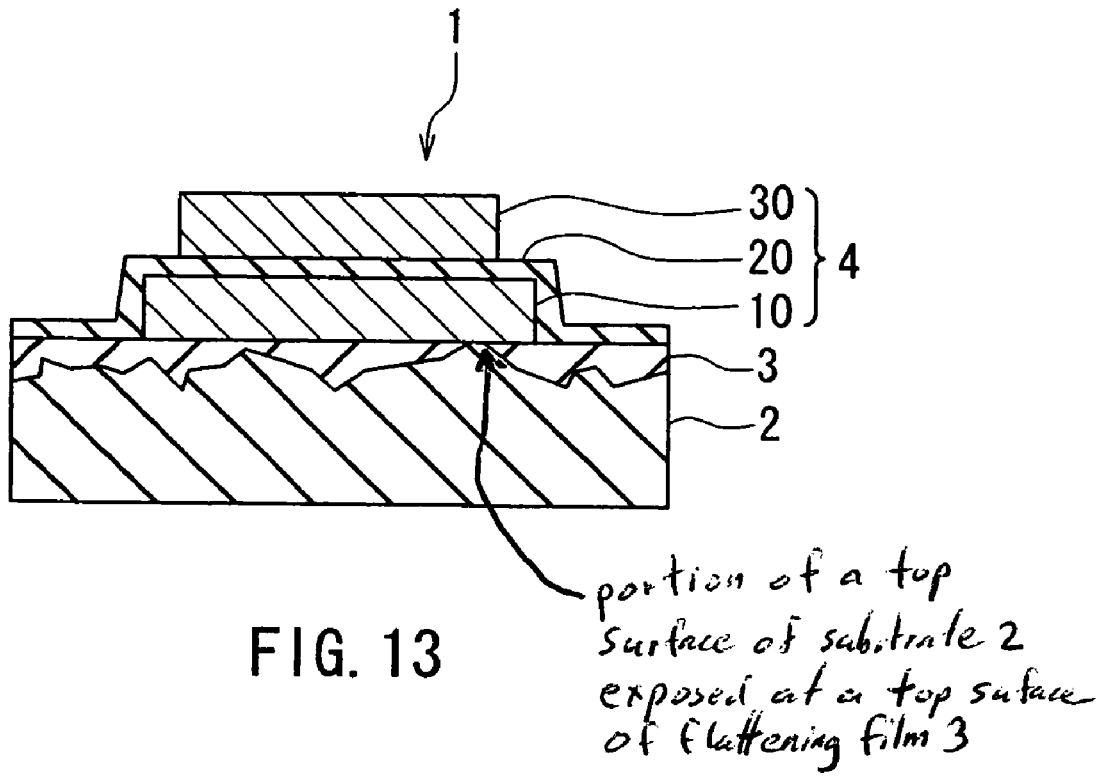
FIG. 13 is a cross-sectional view illustrating a thin-film device of a modification example of the embodiment of the invention.

Reference is now made to FIG. 13 to describe a modification example of the embodiment. FIG. 13 is a cross-sectional view of the thin-film device of the modification example. In the thin-film device 1 of the modification example, a portion of the top surface of the substrate 2 is exposed at the top surface of the flattening film 3. Such a structure can be formed when the top surface of the flattening film 3 is flattened by polishing after the flattening film 3 is formed on the substrate 2. In the modification example, it suffices that the surface roughness in maximum height Rz of the surface made up of the top surface of the flattening film 3 and the portion of the top surface of the substrate 2 exposed at the top surface of the flattening film 3 is equal to or smaller than the thickness of the dielectric film 20. The remainder of configuration, function and effects of the modification example are similar to those of the thin-film device 1 of FIG. 1.

The present invention is not limited to the foregoing embodiment but may be practiced in still other ways. For example, in the thin-film device of the invention, a protection film may be provided on the upper conductor layer 30, or the upper conductor layer 30 may be exposed. Furthermore, one or more additional layers may be provided above the upper conductor layer 30.

In the invention, another dielectric film and conductor layer may be alternately stacked in a total of two or more layers on the top surface of the upper conductor layer 30. As a result, it is possible to form a capacitor having a configuration in which conductor layers and dielectric films are alternately stacked in a total of five or more layers.

The lower conductor layer, the dielectric film and the upper conductor layer of the invention are not limited to the ones constituting a capacitor. For example, each of the lower conductor layer and the upper conductor layer may make up an individual signal line, and the dielectric film may be used to insulate the lower and upper conductor layers from each other.

The thin-film device of the invention may include elements other than a capacitor. Such elements may be passive elements such as inductors and resistors, or may be active elements such as transistors. Such elements may be lumped-constant elements or distributed-constant elements.

The thin-film device of the invention may comprise terminals disposed on sides, the bottom surface or the top surface. The thin-film device of the invention may comprise through holes for connecting a plurality of conductor layers. The thin-film device of the invention may comprise conductor layers for wiring for connecting the lower conductor layer 10 or the upper conductor layer 30 to terminals or other elements. Alternatively, portions of the lower conductor layer 10 or the upper conductor layer 30 may also serve as the terminals, or the lower conductor layer 10 or the upper conductor layer 30 may be connected to the terminals via through holes.

If the thin-film device of the invention incorporates a capacitor and elements other than the capacitor, the thin-film device may be used as a variety of circuit components including a capacitor, such as LC circuit components, various filters including low-pass filters, high-pass filters and band-pass filters, diplexers, and duplexers.

The thin-film device of the invention is utilized for a mobile communications apparatus such as a cellular phone and a communications apparatus for a wireless LAN.

Obviously many modifications and variations of the present invention are possible in the light of the above teachings. It is therefore to be understood that within the scope of the appended claims the invention may be practiced otherwise than as specifically described.

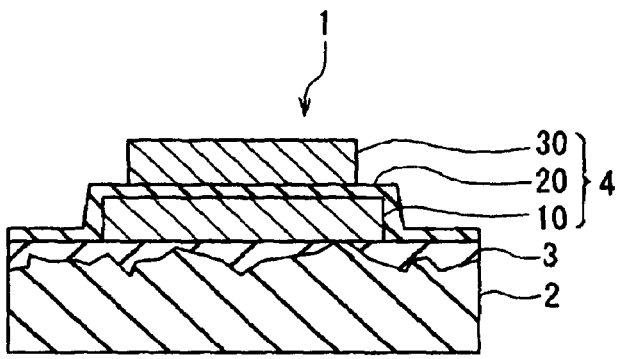

What is claimed is:

1. A thin-film device comprising:
   a substrate;
   a flattening film made of an insulating material and disposed on the substrate;
   a lower conductor layer disposed on the flattening film;
   a dielectric film disposed on the lower conductor layer; and
   an upper conductor layer disposed on the dielectric film, wherein:
   the dielectric film has a thickness that falls within a range of 0.02 to 1 µm inclusive and that is smaller than a thickness of the lower conductor layer;
   a portion of a top surface of the substrate is exposed at a top surface of the flattening film;
   a surface roughness in maximum height of the top surface of the flattening film is smaller than a surface roughness in maximum height of the top surface of the substrate, and is equal to or smaller than the thickness of the dielectric film; and
   a surface roughness in maximum height of a top surface of the lower conductor layer is equal to or smaller than the thickness of the dielectric film.

2. The thin-film device according to claim 1, wherein the flattening film has a thickness that falls within a range of 0.01 to 50 µm inclusive.

3. The thin-film device according to claim 1, wherein the lower conductor layer, the dielectric film and the upper conductor layer constitute a capacitor.

4. A method of manufacturing a thin-film device comprising a substrate, a flattening film made of an insulating material and disposed on the substrate, a lower conductor layer disposed on the flattening film, a dielectric film disposed on the lower conductor layer, and an upper conductor layer disposed on the dielectric film, wherein: the dielectric film has a thickness that falls within a range of 0.02 to 1 µm inclusive and that is smaller than a thickness of the lower conductor layer; a portion of a top surface of the substrate is exposed at a top surface of the flattening film; a surface roughness in maximum height of the top surface of the flattening film is smaller than a surface roughness in maximum height of the top surface of the substrate and is equal to or smaller than the thickness of the dielectric film; and a surface roughness in maximum height of a top surface of the lower conductor layer is equal to or smaller than the thickness of the dielectric film, the method comprising the steps of:
   forming the flattening film on the substrate;
   polishing the top surface of the flattening film so that the portion of the top surface of the substrate is exposed at the top surface of the flattening film,
   forming the lower conductor layer on the flattening film;
   forming the dielectric film on the lower conductor layer; and
   forming the upper conductor layer on the dielectric film.

5. The method according to claim 4, wherein the flattening film has a thickness that falls within a range of 0.01 to 50 µm inclusive.

6. The method according to claim 4, wherein the lower conductor layer, the dielectric film and the upper conductor layer constitute a capacitor.

7. The method according to claim 4, wherein:
   the flattening film is made of an inorganic material; and
   physical vapor deposition or chemical vapor deposition is employed to form the flattening film in the step of forming the flattening film.

8. The method according to claim 4, wherein, in the step of forming the flattening film, the flattening film is formed by applying a material for forming the flattening film to a top of the substrate.

9. The method according to claim 4, further comprising the step of polishing the top surface of the lower conductor layer so that the surface roughness in maximum height of the top surface of the lower conductor layer is equal to or smaller than the thickness of the dielectric film, the step being performed after the step of forming the lower conductor layer and before the step of forming the dielectric film.

* * * * *

UNITED STATES PATENT AND TRADEMARK OFFICE
CERTIFICATE OF CORRECTION

PATENT NO. : 7,608,881 B2   Page 1 of 3
APPLICATION NO. : 11/588321
DATED : October 27, 2009
INVENTOR(S) : Kuwajima et al.

It is certified that error appears in the above-identified patent and that said Letters Patent is hereby corrected as shown below:

The title page, showing an illustrative figure, should be deleted and substitute therefor the attached title page.

Figure 14:
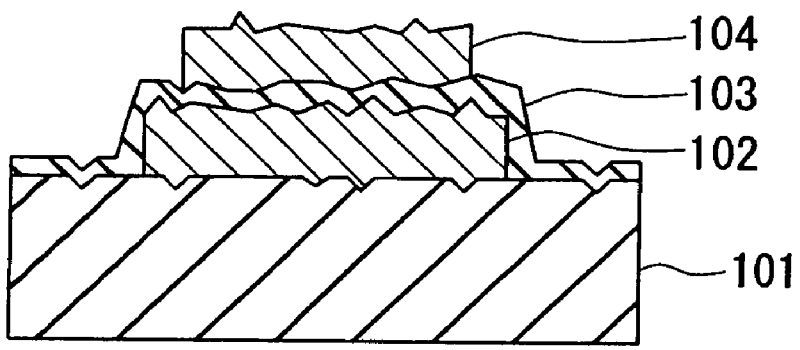
FIG. 14 is a cross-sectional view illustrating an example of configuration of a thin-film device comprising a capacitor.
Figure 13:
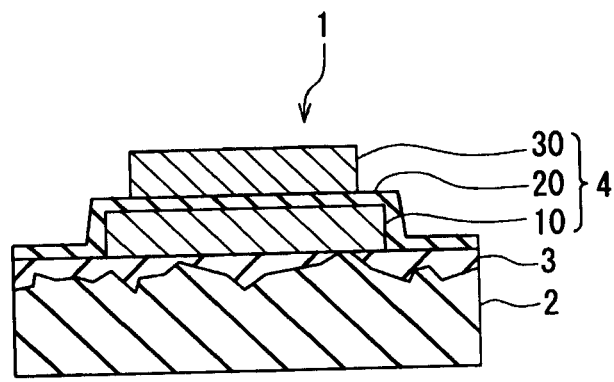
Figure 14:
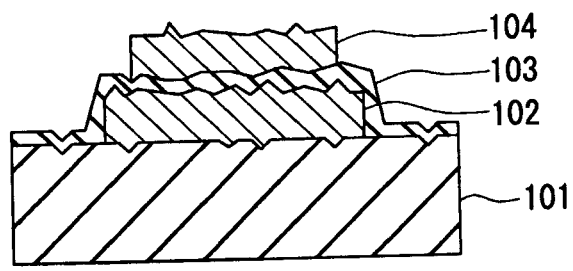

Delete drawing sheets 6 of 6 and substitute therefor the drawing sheet, consisting of figures 13 and 14 as shown on the attached page.

Signed and Sealed this

Twenty-third Day of November, 2010

David J. Kappos
*Director of the United States Patent and Trademark Office*

(12) United States Patent
Kuwajima et al.

(10) Patent No.: US 7,608,881 B2
(45) Date of Patent: Oct. 27, 2009

(54) THIN-FILM DEVICE AND METHOD OF MANUFACTURING SAME

(75) Inventors: Hajime Kuwajima, Tokyo (JP); Masahiro Miyazaki, Tokyo (JP); Akira Furuya, Tokyo (JP)

(73) Assignee: TDK Corporation, Tokyo (JP)

(*) Notice: Subject to any disclaimer, the term of this patent is extended or adjusted under 35 U.S.C. 154(b) by 447 days.

(21) Appl. No.: 11/588,321

(22) Filed: Oct. 27, 2006

(65) Prior Publication Data
US 2007/0120130 A1 May 31, 2007

(30) Foreign Application Priority Data
Nov. 28, 2005 (JP) ............... 2005-342403

(51) Int. Cl.
*H01L 27/108* (2006.01)
*H01L 29/94* (2006.01)
(52) U.S. Cl. ............... 257/301; 257/303; 257/306; 257/307; 257/310; 257/E29.343; 438/243; 438/386; 438/242; 438/244; 438/253; 438/387; 438/396
(58) Field of Classification Search ............... 257/301, 257/303, 306, 307, 310, E29.343; 438/243, 438/386, 242, 244, 251, 387, 396
See application file for complete search history.

(56) References Cited
U.S. PATENT DOCUMENTS

| 5,668,041 | A | * | 9/1997 | Okudaira et al. | ............ 438/240 |
| 7,332,231 | B2 | | 2/2008 | Ichiyanagi et al. | |
| 7,355,113 | B2 | | 4/2008 | Itoigawa et al. | |
| 2005/0093042 | A1 | * | 5/2005 | Nakazawa et al. | .......... 257/295 |
| 2005/0202348 | A1 | * | 9/2005 | Nakayama et al. | .......... 430/311 |
| 2005/0236658 | A1 | * | 10/2005 | Tahara | ...................... 257/306 |

FOREIGN PATENT DOCUMENTS

| JP | A-10-223476 | 8/1998 |
| JP | A 11-168306 | 6/1999 |
| JP | A-2000-100980 | 4/2000 |
| JP | A-2000-228494 | 8/2000 |
| JP | A 2003-017366 | 1/2003 |
| JP | A 2003-347155 | 12/2003 |
| JP | A-2004-207391 | 7/2004 |
| JP | A-2005-136396 | 5/2005 |

* cited by examiner

*Primary Examiner*—Kenneth A Parker
*Assistant Examiner*—Joseph Nguyen
(74) *Attorney, Agent, or Firm*—Oliff & Berridge, PLC

(57) ABSTRACT

A thin-film device comprises: a substrate; a flattening film made of an insulating material and disposed on the substrate; and a capacitor provided on the flattening film. The capacitor incorporates: a lower conductor layer disposed on the flattening film; a dielectric film disposed on the lower conductor layer; and an upper conductor layer disposed on the dielectric film. The thickness of the dielectric film falls within a range of 0.02 to 1 μm inclusive and is smaller than the thickness of the lower conductor layer. The surface roughness in maximum height of the top surface of the flattening film is smaller than that of the top surface of the substrate and equal to or smaller than the thickness of the dielectric film. The surface roughness in maximum height of the top surface of the lower conductor layer is equal to or smaller than the thickness of the dielectric film.

9 Claims, 6 Drawing Sheets